United States Patent
Feudel et al.

(10) Patent No.: US 8,183,605 B2
(45) Date of Patent: May 22, 2012

(54) REDUCING TRANSISTOR JUNCTION CAPACITANCE BY RECESSING DRAIN AND SOURCE REGIONS

(75) Inventors: Thomas Feudel, Radebeul (DE); Markus Lenski, Dresden (DE); Andreas Gehring, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/791,290

(22) Filed: Jun. 1, 2010

(65) Prior Publication Data
US 2010/0237431 A1 Sep. 23, 2010

Related U.S. Application Data

(62) Division of application No. 12/027,583, filed on Feb. 7, 2008, now Pat. No. 7,754,556.

(30) Foreign Application Priority Data

Jun. 29, 2007 (DE) .......................... 10 2007 030 053

(51) Int. Cl.
*H01L 29/80* (2006.01)
*H01L 27/01* (2006.01)
*H01L 21/8238* (2006.01)
*H01L 21/336* (2006.01)
*H01L 21/425* (2006.01)

(52) U.S. Cl. ........ 257/262; 257/274; 257/279; 257/347; 257/369; 257/E21.051; 257/E21.054; 257/E21.431; 438/199; 438/230; 438/279; 438/308; 438/530

(58) Field of Classification Search ................... 438/199, 438/230, 279, 303, 308, 514, 530; 257/262, 257/274, 347, 369, E21.051, E21.054, E21.06, 257/E21.431
See application file for complete search history.

(56) References Cited

U.S. PATENT DOCUMENTS

| | | | | |
|---|---|---|---|---|
| 7,112,848 B2 * | 9/2006 | Lee | ............................... | 257/347 |
| 7,329,571 B2 * | 2/2008 | Hoentschel et al. | .......... | 438/199 |
| 7,381,622 B2 * | 6/2008 | Hellmich et al. | ............. | 438/300 |
| 7,579,262 B2 * | 8/2009 | Hoentschel et al. | .......... | 438/478 |
| 7,649,232 B2 * | 1/2010 | Tamura et al. | ................ | 257/383 |
| 7,754,555 B2 * | 7/2010 | Gehring et al. | ............... | 438/199 |
| 2004/0227185 A1 * | 11/2004 | Matsumoto et al. | .......... | 257/347 |
| 2007/0096195 A1 * | 5/2007 | Hoentschel et al. | .......... | 257/315 |
| 2007/0200176 A1 * | 8/2007 | Kammler et al. | ............. | 257/347 |
| 2007/0228482 A1 * | 10/2007 | Wei et al. | ...................... | 257/369 |
| 2007/0232006 A1 * | 10/2007 | Hellmich et al. | ............. | 438/300 |
| 2007/0252204 A1 * | 11/2007 | Wei et al. | ...................... | 257/347 |
| 2008/0090349 A1 * | 4/2008 | Hoentschel et al. | .......... | 438/229 |
| 2008/0164491 A1 * | 7/2008 | Liu et al. | ...................... | 257/190 |
| 2008/0251851 A1 * | 10/2008 | Pan et al. | ...................... | 257/369 |

* cited by examiner

*Primary Examiner* — Hsien Ming Lee
(74) *Attorney, Agent, or Firm* — Williams, Morgan & Amerson

(57) ABSTRACT

By recessing portions of the drain and source areas on the basis of a spacer structure, the subsequent implantation process for forming the deep drain and source regions may result in a moderately high dopant concentration extending down to the buried insulating layer of an SOI transistor. Furthermore, the spacer structure maintains a significant amount of a strained semiconductor alloy with its original thickness, thereby providing an efficient strain-inducing mechanism. By using sophisticated anneal techniques, undue lateral diffusion may be avoided, thereby allowing a reduction of the lateral width of the respective spacers and thus a reduction of the length of the transistor devices. Hence, enhanced charge carrier mobility in combination with reduced junction capacitance may be accomplished on the basis of reduced lateral dimensions.

24 Claims, 5 Drawing Sheets

REDUCING TRANSISTOR JUNCTION CAPACITANCE BY RECESSING DRAIN AND SOURCE REGIONS

This application is a divisional of Ser. No. 12/027,583, filed Feb. 7, 2008 now U.S. Pat. No. 7,754,556.

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures in SOI configuration, having highly doped junctions with reduced junction capacitance.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are, and will be, based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions at least at the area in the vicinity of the channel region, i.e., source and drain extension regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure and, therefore, one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. A defined degree of blurring may be advantageous for defining critical transistor properties, such as the overlap between the extension regions and the gate electrode.

In other areas of the drain and source regions, that is, in deeper lying portions, the diffusion may result in a reduction of the dopant concentration at the corresponding PN junction areas, thereby reducing the conductivity at the vicinity of theses areas.

Thus, on the one hand, a high anneal temperature may be desirable in view of a high degree of dopant activation, re-crystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the average dopant concentration. Furthermore, very high temperatures during the anneal process may negatively affect the gate insulation layer, thereby reducing the reliability thereof. That is, high anneal temperatures may degrade the gate insulation layer and thus may influence the dielectric characteristics thereof, which may result in increased leakage currents, reduced breakdown voltage and the like. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

Recently, advanced anneal techniques have been developed in which extremely high temperatures may be achieved at a surface portion of the substrate, thereby transferring sufficient energy to the atoms for activating the dopants and re-crystallizing lattice damage wherein, however, the duration of the treatment is short enough to substantially prevent a significant diffusion of the dopant species and other impurities contained in the carrier material. Respective advanced anneal techniques are typically performed on the basis of radiation sources that are configured to provide light of appropriate wavelength that may be efficiently absorbed in upper portions of the substrate and any components formed thereon, wherein the effective duration of the irradiation may be controlled to a desired small time interval, such as a few milliseconds and significantly less. For instance, respective flash lamp exposure sources are available which provide light of a defined wavelength range resulting in a surface-near heating of material, thereby providing the conditions for short range motions of the respective atoms in the materials provided near the surface of the carrier material. In other cases, laser radiation may be used, for instance, in the form of short laser pulses or a continuous beam that may be scanned across the substrate surface on the basis of an appropriate scan regime in order to obtain the desired short term heating at each point on the substrate. Thus, contrary to traditional rapid thermal anneal (RTA) processes, in which frequently the entire carrier material may be heated to a desired temperature, the radiation-based advanced anneal techniques cause non-equilibrium conditions wherein a high amount of energy is supplied within extremely short time intervals, thereby providing the required extremely high temperatures at a very thin surface layer, while the remaining material of the substrate may remain substantially unaffected by the energy deposition during the anneal process. Thus, in advanced manufacturing regimes, traditional RTA processes may frequently be replaced by advanced radiation-based anneal processes in order to obtain a high degree of dopant activation and re-crystallization in drain and source regions while not unduly contributing to dopant diffusion, which may be advantageous in terms of a steep dopant gradient at the respective PN junctions. However, adjusting the effective channel length on the basis of a well-controlled diffusion of the dopants may be difficult to be integrated in the conventional process flow unless significant efforts may be made, thereby resulting in additional process complexity. On the other hand, the definition of the effective channel length on the basis of conventional well-established anneal techniques may require an increased spacer width and thus increased lateral dimensions of the transistor, when an efficient process flow is to be maintained.

A further issue related to the lateral and vertical dopant profile of the drain and source regions and thus of the PN junctions may be presented by the overall capacitance of the PN junctions, which is roughly related to the effective interface formed by the PN junctions with respect to the remaining active region of the semiconductor device. In order to further enhance the performance of SOI transistors, the parasitic capacitance of the PN junctions may be significantly reduced by designing the vertical dopant profile in such a manner that a high dopant concentration is obtained that extends down to the buried insulating layer. In this way, only the laterally oriented interface, i.e., the PN junction of the drain and source regions, contribute to the overall junction capacitance, while additionally the high dopant concentration extending down to the buried insulating layer provides the desired PN junction characteristics and also a reduced overall series resistance in the drain and source regions. However, providing deep drain and source regions with high dopant concentrations down to the buried insulating layer may require sophisticated implantation techniques, thereby contributing to the overall process complexity. In other cases, a moderately high dopant concentration at the buried insulating layer may be accomplished by adjusting the process parameters of the respective anneal processes in such a way that the diffusion of the dopants during the anneal process may result in the desired vertical dopant profile. The respective anneal parameters may, however, not be compatible with the requirement of a reduced transistor length, since also a lateral diffusion, for instance in the extension regions, may take place and result in a modified channel length which may therefore require increased spacer widths to accommodate the increased diffusion activity during a respective anneal process. Thus, high temperature anneal processes with extended process times for inducing high diffusion activity and thus generating a high thermal budget may be a less attractive approach in view of increasing the packing density of sophisticated semiconductor devices.

Moreover, techniques have been recently developed in which the transistor performance, for instance, the performance of P-channel transistors, may be significantly enhanced by providing a strained semiconductor material, such as a silicon/germanium compound, which may be formed in drain and source regions of silicon-based active transistor areas. The strained silicon/germanium compound, which may also be referred to as a silicon/germanium alloy, may be provided in a strained state due to a mismatch of the lattice spacing of natural silicon and natural silicon/germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. When providing the strained silicon/germanium alloy in the drain and source regions, the respective stress created by the strained material may act on the channel region of the transistor, thereby creating a respective compressive strain therein, which may enhance the charge carrier mobility therein. In highly scaled transistor devices based on the SOI architecture, significant benefits with respect to performance may be achieved by providing a highly strained semiconductor alloy in the vicinity of the channel region that extends along a significant portion in the depth direction in the semiconductor layer. Consequently, an efficient strain-inducing mechanism in SOI devices, in combination with a reduced parasitic junction capacitance, may result in an overall performance gain, while additionally a highly reduced thermal budget of the respective anneal processes may be desirable to provide the potential for reducing the lateral dimensions of the transistor devices, as explained above. Hence, in view of the situation described above, advanced techniques may be desirable for improving the transistor characteristics while not unduly contributing to process complexity and/or compromising the scalability of the respective process technique.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to methods and semiconductor devices aiming at enhancing the transistor performance and reducing the overall transistor dimensions in SOI devices by reducing the thickness of a respective active semiconductor layer of the SOI device prior to forming respective deep drain and source regions. The respective process for the material removal may be performed at an appropriate manufacturing stage so as to provide the possibility of incorporating a strained semiconductor alloy in a preceding manufacturing stage, wherein the strained semiconductor alloy may be maintained along the depth direction in its initial thickness in the vicinity of the channel region when removing material from the drain and source areas. Consequently, the reduced thickness of the drain and source areas prior to the implantation of the deep drain and source regions enables the incorporation of the dopant species with high concentration so as to extend down to the buried insulating layer on the basis of efficient implantation parameters, thereby providing the potential for designing the respective anneal process for activating the dopants and re-crystallizing the drain and source regions in view of the desired lateral dopant profile rather than having to diffuse the dopants down to the buried insulating layer for obtaining a reduced junction capacitance. Consequently, the overall lateral transistor dimensions may be reduced compared to strategies using anneal parameters for inducing high diffusion activity, while nevertheless an efficient strain-inducing mechanism may be incorporated in the form of a strained semiconductor alloy in the drain and source regions.

One illustrative method disclosed herein comprises forming drain and source extension regions in a semiconductor region of a transistor by performing a first ion implantation process using a gate electrode structure of the transistor as an implantation mask. The method further comprises forming a spacer structure at sidewalls of the gate electrode structure and recessing the semiconductor region by performing an etch process. Furthermore, the method comprises performing a second ion implantation process for forming drain and source regions using the spacer structure as an implantation mask, wherein the drain and source regions extend to a buried insulating layer that is located below the semiconductor region. Additionally, the method comprises performing an anneal process for activating dopants of the drain and source regions.

Another illustrative method disclosed herein comprises forming a first strained semiconductor alloy in a first semiconductor region of a first transistor, wherein the first strained semiconductor alloy is located at least partially in drain and source areas and induces a first type of strain in a channel region of the first transistor. The illustrative method further comprises forming a recess in a portion of each of the drain and source areas of the first transistor. Additionally, the method comprises implanting a dopant species into the drain and source areas to form deep drain and source regions that extend to a buried insulating layer, in which is formed the first semiconductor region.

An illustrative semiconductor device disclosed herein comprises a first transistor having recessed drain and source regions, which extend to a buried insulating layer. The semiconductor device further comprises a strained semiconductor alloy provided partially in the drain and source regions, wherein the strained semiconductor alloy induces a strain in a channel region of the first transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
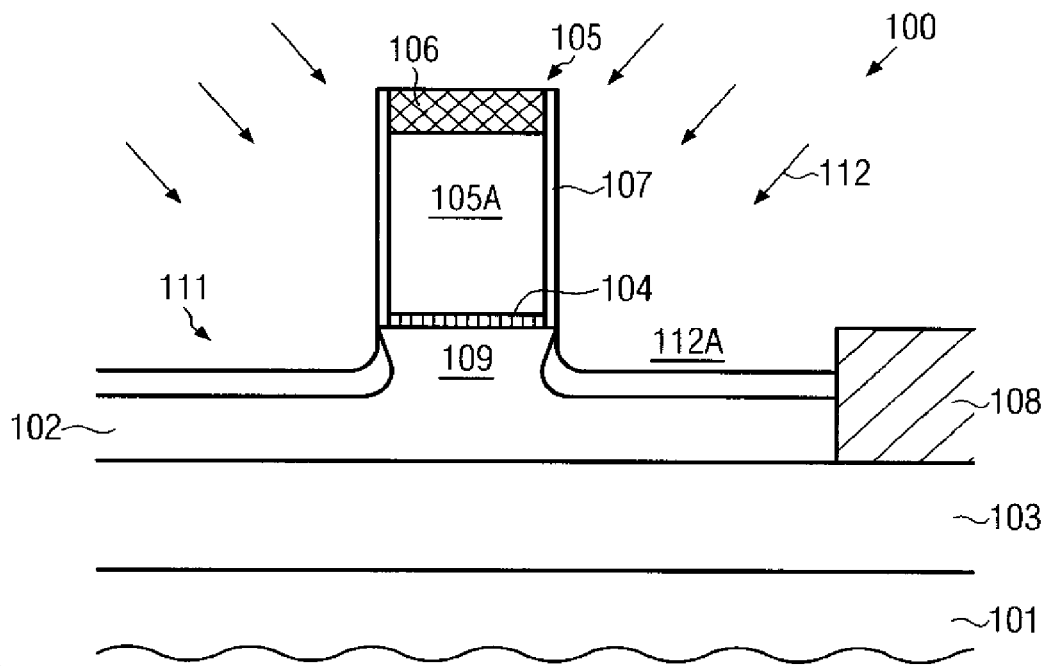
FIGS. 1a-1f schematically illustrate cross-sectional views of a transistor device during various manufacturing stages in forming deep drain and source regions extending down to the buried insulating layer of an SOI configuration, wherein respective portions are recessed prior to performing the ion implantation for defining the deep drain and source regions according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein generally relates to manufacturing techniques and respective semiconductor devices including advanced transistor elements based on a silicon-on-insulator (SOI) configuration and having critical dimensions of, for example, 100 nm and significantly less, in which the transistor performance may be substantially determined by the overall resistance of the conductive path building up between the drain and source contacts and by the capacitance of the respective body region. For enhancing the overall transistor performance, the various aspects disclosed herein provide the possibility of efficiently incorporating a strained semiconductor material in the drain and source areas of the transistor to enhance the charge carrier mobility in the channel region, while nevertheless enabling the formation of deep drain and source regions with high dopant concentration extending to the buried insulating layer to reduce the junction capacitance while nevertheless substantially maintaining the strain-inducing mechanism of the strained semiconductor alloy. Furthermore, appropriate anneal techniques may be used which allow a reduced thermal budget which may therefore enable a reduction of the transistor length, as is previously explained.

A desired high dopant concentration in the deep drain and source region may be obtained on the basis of an additional etch process that may be performed prior to the respective implantation process on the basis of an appropriate spacer structure to provide a desired lateral offset with respect to a strained semiconductor alloy, thereby maintaining a significant portion of this semiconductor alloy along the entire extension thereof in the depth direction so as to not unduly affect the strain-inducing mechanism thereof. Thus, according to the principles disclosed herein, a high dopant concentration may be provided in the deep drain and source regions reaching down to the buried insulating layer, while the effective channel length, for instance the degree of overlap between the gate electrode and the drain and/or source extension regions, may also be designed with respect to enhanced transistor performance, irrespective of the vertical dopant profile in the deep drain and source regions. Furthermore, by performing the implantation process for defining the deep drain and source regions on the basis of a recessed semiconductor material, the vertical extensions of these regions may be adjusted on the basis of the ion implantation process, wherein the subsequent dopant activation may be performed with respect to the overall lateral dopant profile without requiring a significant vertical diffusion so that sophisticated anneal techniques, substantially without diffusion or without a significantly reduced degree of diffusion, may be efficiently used to obtain a desired high degree of dopant activation.

In some illustrative embodiments, the anneal process may include several steps which may be performed at different manufacturing phases including specifically designed process parameters to adjust a desired lateral diffusion in the extension regions, if desired, while a subsequent short-term anneal process may provide the desired degree of dopant activation, substantially without significantly affecting the lateral dopant profile obtained by the specifically designed anneal steps. For example, after implanting respective dopant species for forming the drain and source extension regions, an appropriate anneal process may be performed to finely tune the lateral dopant profile, if required, and thereafter recessing of the remaining drain and source area and implanting the dopant species into the deep drain and source areas may be accomplished on the basis of an appropriately designed spacer structure, thereby providing the desired lateral offset for maintaining a sufficient amount of strained semiconductor alloy, if provided. Subsequently, efficient dopant activation may be accomplished on the basis of an advanced radiation-based anneal process, substantially without altering the previously established lateral dopant profile.

As a consequence, the effective surface area available for forming the PN junction in the SOT transistor may be significantly reduced since the drain and source regions may be bordered in the depth direction by the buried insulating layer, thereby resulting in a reduction of the overall capacitance of the SOI transistor body. In combination with an efficient strain-inducing semiconductor alloy, the reduced parasitic capacitance may therefore provide an increased transistor performance wherein additionally the overall lateral dimensions in the transistor length direction may be reduced due to the possibility of selecting a reduced spacer width for defining the lateral dopant profile.

It should be appreciated that the principles disclosed herein are highly advantageous in the context of semiconductor devices including transistor elements having a gate length of approximately 50 nm and less, since here pronounced dopant profiles at the PN junctions are required, while the degree of dopant activation and the charge carrier mobility in the channel region may also be important aspects in view of the reduction of the overall series resistance of the transistor. The techniques disclosed herein may nevertheless also be efficiently applied to less critical semiconductor devices, thereby providing reduced yield losses and enhanced device uniformity due to a reduced thermal budget, resulting in less diffusion both in the vertical and lateral dimension, which may translate into a reduced parameter fluctuation. Consequently, the present disclosure should not be considered as being restricted to specific device dimensions unless such restrictions are explicitly set forth in the description or the appended claims.

FIG. 1a schematically illustrates a cross-sectional view of a semiconductor device 100, which, in one illustrative embodiment, represents a field effect transistor. The semiconductor device 100 may comprise a substrate 101 having formed thereabove a semiconductor layer 102, such as a silicon-based semiconductor layer, which is to be understood as a semiconductor material comprising silicon, possibly in combination with other species, such as germanium, carbon and the like. In the manufacturing stage shown, the semiconductor layer 102 may include recesses 112A formed in an active semiconductor region 111, i.e., a part of the semiconductor layer 102, in which a defined conductivity is to be established on the basis of a dopant profile. The semiconductor region 111 may be defined by an isolation structure 108 that may be comprised of any appropriate dielectric material, such as silicon dioxide, silicon nitride and the like, and may be provided, for instance, in the form of a trench isolation, thereby defining the active semiconductor region 111, in which a channel region 109 and respective drain and source regions (not shown) are to be formed. The semiconductor device 100 may further comprise a buried insulating layer 103 provided between the substrate 101 and the semiconductor layer 102, thereby defining an SOI configuration, wherein the buried insulating layer 103 may be comprised of any appropriate dielectric material, such as silicon dioxide, silicon nitride and the like. In other cases, the semiconductor device 100 may represent a "bulk" configuration in which the semiconductor layer 102 may have a thickness that is significantly greater than a vertical depth of any circuit element formed therein so that a common semiconductor body may be provided for a large number of circuit elements. In other cases, the semiconductor device 100 may comprise an SOI configuration, as shown in FIG. 1a, in combination with bulk configurations (not shown), when high performance transistor elements may be required in combination with transistors benefiting from a bulk configuration.

In this respect, it should be appreciated that any statements with respect to the position of features of the semiconductor device 100 or any other semiconductor devices described herein are to be considered as relative positional information, wherein the substrate 101 or the buried insulating layer 103 or a respective well-defined surface or interface formed by these components may represent a reference. That is, terms such as "above," "over," "on" and other similar terms referring to a stacked configuration may indicate a position with respect to a surface or a layer, such as the buried insulating layer 103 and/or the substrate 101, in order to indicate that a feature under consideration has a greater distance to the substrate or the buried insulating layer 103 compared to a feature that is located "below" the feature under consideration. In this sense, the semiconductor layer 102 is, for instance, formed above the buried insulating layer 103. Similarly, a lateral direction may represent a direction that extends substantially parallel to the buried insulating layer 103 or any interface formed with the substrate 101. Hence, lateral directions may be understood as a horizontal direction in FIG. 1a, representing a transistor length direction, and a direction substantially perpendicular to the drawing plane of FIG. 1a, representing a transistor width direction.

The semiconductor device 100 may further comprise a gate electrode structure 105 formed above the semiconductor layer 102 and separated therefrom by a gate insulation layer 104. The gate electrode structure 105 may comprise an electrode portion 105A, which may represent a conductive portion of the electrode structure 105 and which may have a length of approximately 50 nm and less. On sidewalls of the electrode portion 105A, an offset spacer 107 may be provided which may be comprised of any appropriate material, such as silicon dioxide, silicon nitride and the like. It should be understood that the gate electrode structure 105 may be provided in the form of any appropriate material, such as polysilicon and the like, for the electrode portion 105A, while, in other illustrative embodiments, the term "gate electrode structure" may also represent a placeholder or sacrificial structure, which may be replaced by any appropriate material in a later manufacturing stage. Furthermore, in the embodiment shown, the gate electrode structure 105 may comprise a cap layer 106 comprised of any appropriate material, such as silicon nitride, silicon dioxide and the like.

The semiconductor device 100 as shown in FIG. 1a may be formed on the basis of the following processes. After providing the substrate 101 having formed thereon the buried insulating layer 103 and the semiconductor layer 102, the isolation structure 108 may be formed on the basis of well-established techniques, including, for instance, photolithography, etch techniques, deposition and planarization processes. Thereafter, an appropriate dopant concentration may be created in the semiconductor region 111 defined by the isolation structure 108 on the basis of well-established implantation techniques. Next, the gate electrode structure 105 and the gate insulation layer 104 may be formed by well-established techniques, wherein, for instance, material of the gate insulation layer 104 may be provided by sophisticated oxidation and/or deposition techniques, which may include surface treatments and the like, followed by the deposition of an appropriate material for the electrode portion 105A. Thereafter, sophisticated lithography and etch processes may be performed to obtain the electrode portion 105A and the gate insulation layer 104. For instance, during the patterning of the electrode portion 105A, the cap layer 106 may also be provided, which may represent a portion of a previously deposited material layer. Thereafter, the electrode portion 105A, possibly including the cap layer 106, may be "encapsulated" by forming the offset spacers 107 on the basis of well-established deposition and anisotropic etch techniques. The cap layer 106 and the offset spacer 107 may provide sufficient etch resistance during a subsequent etch process 112 designed to remove material from the semiconductor layer 102, thereby forming respective recesses 112A, which may be refilled by an appropriate semiconductor alloy, as will be described later on. A size and shape of the recesses 112A may be defined by the width of the offset spacers 107 and/or by the process parameters of the etch process 112, which may be designed as a substantially anisotropic etch process, an isotropic etch process or any combination thereof. The depth of the recess 112A may be selected such that a certain amount of material of the layer 102 may be maintained above the buried insulating layer 103, while nevertheless a significant portion along the depth direction of the layer 102 may be refilled with a strained semiconductor alloy so as to exert a specific stress on the channel region 109 along a significant depth of the layer 102.

It should be appreciated that, in other device areas, respective recesses 112A may not be formed when considered inappropriate for respective transistors. In this case, a respective etch mask may be provided when patterning the offset spacers 107 in order to maintain the respective spacer material in these device areas.

Figure 1B:
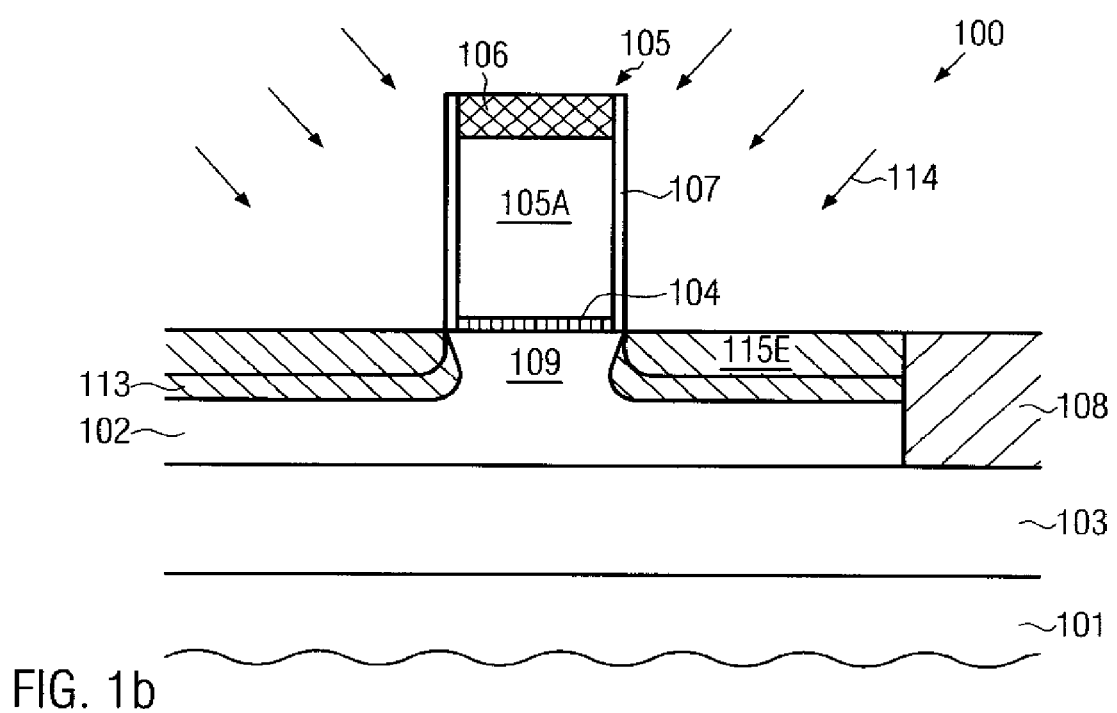

FIG. 1b schematically illustrates the semiconductor device 100 in a further advanced manufacturing stage. As shown, the recesses 112A have been refilled with a strained semiconductor material 113, such as silicon/germanium, silicon/carbon, silicon/germanium/tin and the like. The strained semiconductor alloy 113 may be formed on the basis of, for instance, selective epitaxial growth techniques in which a significant material deposition may be substantially restricted to exposed areas of the semiconductor layer 102, hence a significant deposition of material on the gate electrode structure 105 and the isolation structures 108 may be avoided. During the respective epitaxial growth, the semiconductor alloy 113 may substantially take on the crystalline structure when the natural crystalline structure of the alloy 113 is similar to the crystalline structure of the template material of the layer 102. Thus, the alloy 113 may also substantially adopt the respective lattice spacing and may therefore grow in a strained state, wherein the type and magnitude of strain are substantially determined by the composition and the concentration of the various components of the alloy 113. For instance, silicon/germanium alloy grown on a substantially silicon-based unstrained material may result in significant compressive strain, thereby also inducing a respective compressive strain in the channel region 109, as previously explained. For example, a germanium concentration of 20-30 atomic percent and more may result in a significant enhancement of the hole mobility within the channel region 109, when the device 100 represents a P-channel transistor.

In other illustrative embodiments, the semiconductor alloy 113 may represent any other appropriate material, such as silicon/carbon, which has a natural lattice constant that is less compared to silicon, thereby resulting in a growth of a tensile-strained alloy. The semiconductor alloy 113 having a compressive strain or tensile strain may be formed on the basis of well-established deposition techniques using the recesses 112A, as previously described, while, in other illustrative embodiments, the semiconductor alloy 113 may be formed on the basis of other process techniques, such as implantation and the like. For instance, the etch process 112 may be omitted or may be performed in selected areas of the device 100 and, in those areas that do not include the recesses 112A, the strained semiconductor alloy 113 may be formed on the basis of an appropriately designed ion implantation sequence for incorporating, for instance, germanium, tin, carbon and the like. For instance, a compressive semiconductor alloy may be formed by implanting germanium and/or tin, possibly using a preceding amorphization implantation, and re-crystallizing the material in the layer 102, thereby resulting in a compressively strained semiconductor alloy 113. In other cases, carbon may be implanted into the semiconductor layer 102, for instance, preceded by an amorphization implantation and, upon re-crystallizing the damage areas, the semiconductor alloy 113 may be formed with tensile strain. In still other illustrative embodiments, forming the strained semiconductor alloy 113 by appropriate deposition techniques on the basis of the recesses 112A may be combined with implantation processes performed in other device areas, which may be advantageous when appropriate selective deposition techniques may not be efficiently used under production conditions. For example, a compressive semiconductor alloy may be formed in the recesses 112A on the basis of selective epitaxial growth, while a tensile semiconductor alloy may be formed on other device areas on the basis of carbon-based implantation techniques.

Thereafter, the offset spacers 107, possibly in combination with a portion of the cap layer 106, may be removed by any appropriate etch processes or, in other cases, when the width of the spacers 107 is considered appropriate for a subsequent ion implantation process 114, the spacers 107 may be used as an implantation mask for defining a specific offset of drain and source extension regions 115E. Prior to or after the implantation process 114, other implantation processes may be performed, for instance, for forming a so-called halo region (not shown) in order to obtain a required steep dopant gradient at the PN junctions defined by extension regions 115E and the channel region 109. For example, a respective halo implantation may include tilted implantation processes to incorporate the dopant of inverse conductivity type compared to dopants of the extension regions 115E below the edges of the electrode portion 105A.

Figure 1C:
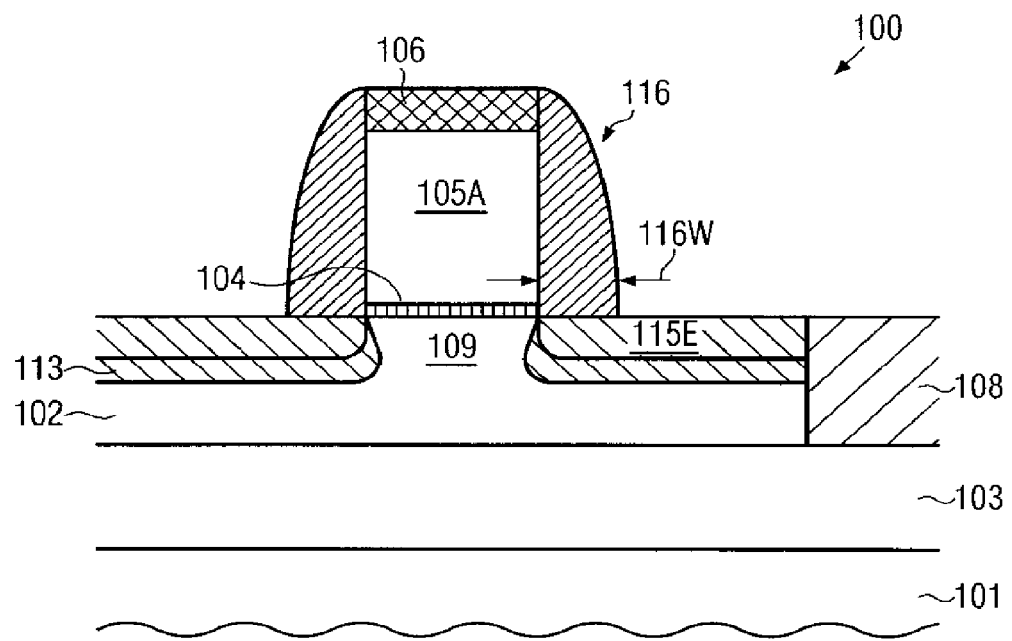

FIG. 1c schematically illustrates the semiconductor device 100 in a further advanced manufacturing stage. As shown, a spacer structure 116 may be formed on sidewalls of the gate electrode structure 105, which may still include respective offset spacers, such as the spacer 107, whereas, in other cases, respective offset spacers may have been removed. Furthermore, the cap layer 106 or a portion thereof may still cover a top surface of the electrode portion 105A. The spacer structure 116 may be provided with a width 116W that may be selected so as to substantially define the lateral dopant profile of deep drain and source regions still to be formed. Since a significant diffusion in the vertical direction may not be required for allowing the deep drain and source regions to extend down to the buried insulating layer 103, a respective lateral diffusion may therefore not have to be accommodated by the spacer width 116W, thereby enabling a reduced lateral dimension of the device 100. The spacer structure 116 may be formed on the basis of well-established techniques which may include the deposition of any appropriate material, such as silicon nitride, silicon dioxide and the like, followed by appropriate etch techniques.

Figure 1D:
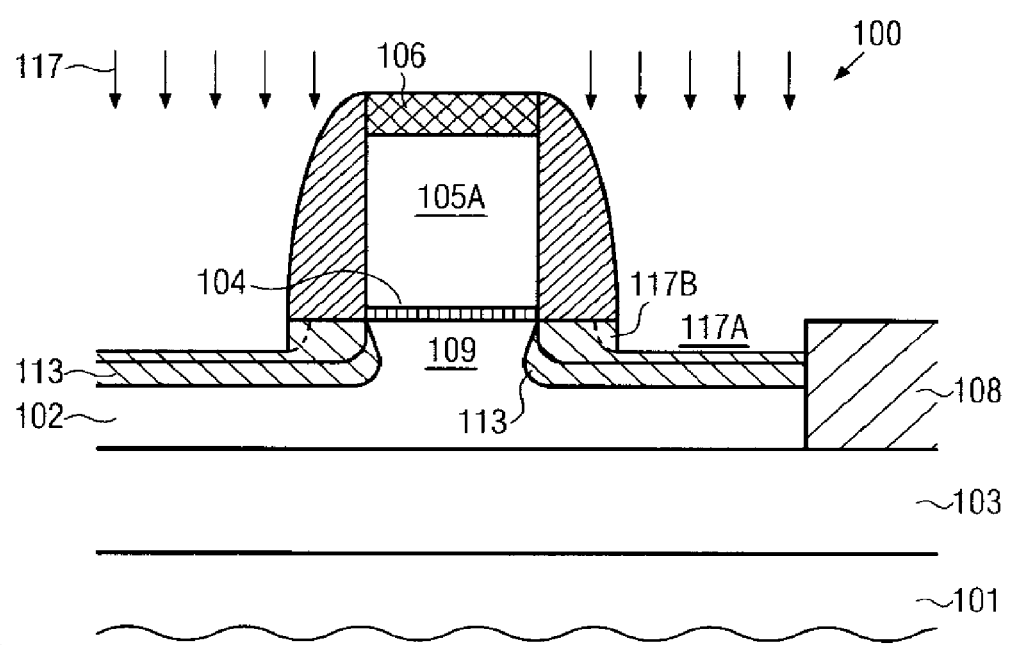

FIG. 1d schematically illustrates the semiconductor device 100 during an etch process 117 for removing material of the semiconductor layer 102 from the strained semiconductor alloy 113, thereby forming recesses 117A. The etch process 117 may be performed on the basis of well-established etch recipes, wherein the degree of isotropy may be selected in accordance with device requirements. That is, the respective process parameters, such as etch chemistry, plasma parameters, if a dry-etch process is used, and the like, may be selected to obtain a respective directionality during the process 117. For instance, highly anisotropic etch techniques may be used for selectively removing the material of the layer 102, thereby forming the recess 117A such that its offset with respect to the channel region 109 is substantially determined by the spacer width 116W. In other cases, a substantially isotropic behavior may be selected for the process 117, thereby obtaining a certain degree of under-etching, as indicated by the dotted line 117B. For example, using isotropic etch recipes may provide a high degree of selectivity with respect to other materials, such as the isolation structure 108 and the spacer structure 116. The etch process 117 may be controlled on the basis of etch time, wherein, based on an estimated or measured etch rate, the desired depth of the recesses 117A may be adjusted.

In other illustrative embodiments, a respective implantation process may have been performed, for instance, prior to or after the formation of the extension regions 115E, in order to incorporate an appropriate indicator species at a desired depth, which may then be released during the etch process 117, thereby providing an efficient signal for controlling the etch process 117. For instance, any appropriate species that provides a well-detectable endpoint detection signal in optical endpoint detection systems, as are typically used in plasma-based etch processes, may be implanted, wherein moderately low concentrations may be sufficient, when a respective "exotic" candidate may be selected. Thus, variations in etch rate which may result in substrate-to-substrate variations of the depth of the recesses 117A may be efficiently suppressed. In other illustrative embodiments, a respective etch indicator species may be incorporated during the process for forming the strained semiconductor alloy 113. For instance, during the selective epitaxial growth process, a respective indicator species may be added to the deposition ambient, thereby defining a moderately sharp boundary between portions having the indicator material and portions lacking the indicator material. Since, typically, deposition processes may be controlled with increased accuracy and may suffer from minor process fluctuations compared to respective etch processes, in this case, generally a reduced substrate-to-substrate variation of the recesses 117A may be achieved.

Figure 1E:
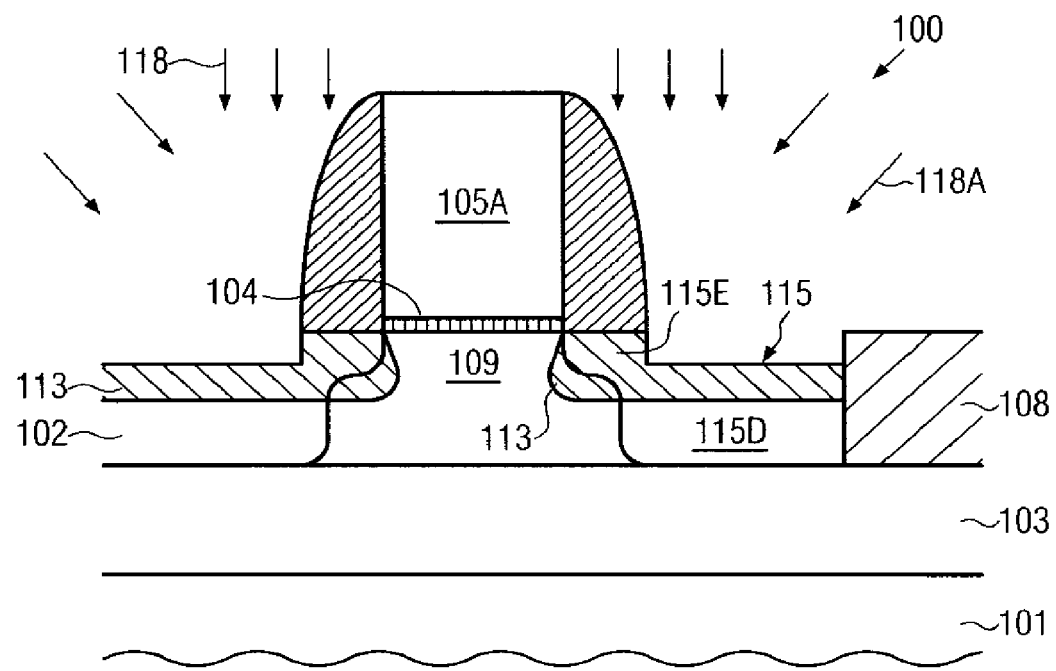

FIG. 1e schematically illustrates the semiconductor device 100 in a further advanced manufacturing stage, in which a further implantation process 118 is performed to define deep drain and source regions 115D that extend at least down to the buried insulating layer 103 with a moderately high dopant concentration, which may be accomplished due to the fact that a significant portion of the semiconductor material of the alloy 113 is missing. Hence, the implantation process 118 may result in a moderately high concentration across the entire depth of the deep drain and source regions 115D, providing the potential for avoiding complex implantation sequences with different implantation energies that may otherwise be necessary for providing the various concentration maxima at different depths of the corresponding semiconductor material. In some illustrative embodiments, the implantation process 118 may comprise a tilted implantation 118A so as to increase the dopant concentration at the drain and source extension regions 115E and to also provide an increased concentration below the spacer structure 116, thereby reducing the respective series resistance. In some illustrative embodiments, as shown, the cap layer 106 may be removed prior to the implantation 118 when a respective dopant concentration may be desired in the electrode portion 105A. For this purpose, the thickness of the cap layer 106 may have been reduced to an appropriate value required for acting as an efficient etch mask during the etch process 117 and subsequently the cap layer 106 of reduced thickness may be removed by any appropriate highly selective etch process, in which the spacer structure 116 may not be significantly affected. In other cases, any reduction in the spacer width 116W during a corresponding process for removing the cap layer 106 may be accommodated by a corresponding degree of under-etching, as is previously explained with reference to FIG. 1d.

Consequently, after the ion implantation process 118, possibly comprising a tilted implantation sequence 118A, drain and source regions 115 are formed which are comprised of the extension regions 115E and the deep drain and source regions 115D having a high dopant concentration reaching down to the buried insulating layer 103, while, within the drain and source regions 115 below the spacer structure 116, the strained semiconductor alloy 113 is maintained with its original thickness, thereby providing an efficient strain-inducing mechanism in the channel region 109.

Figure 1F:
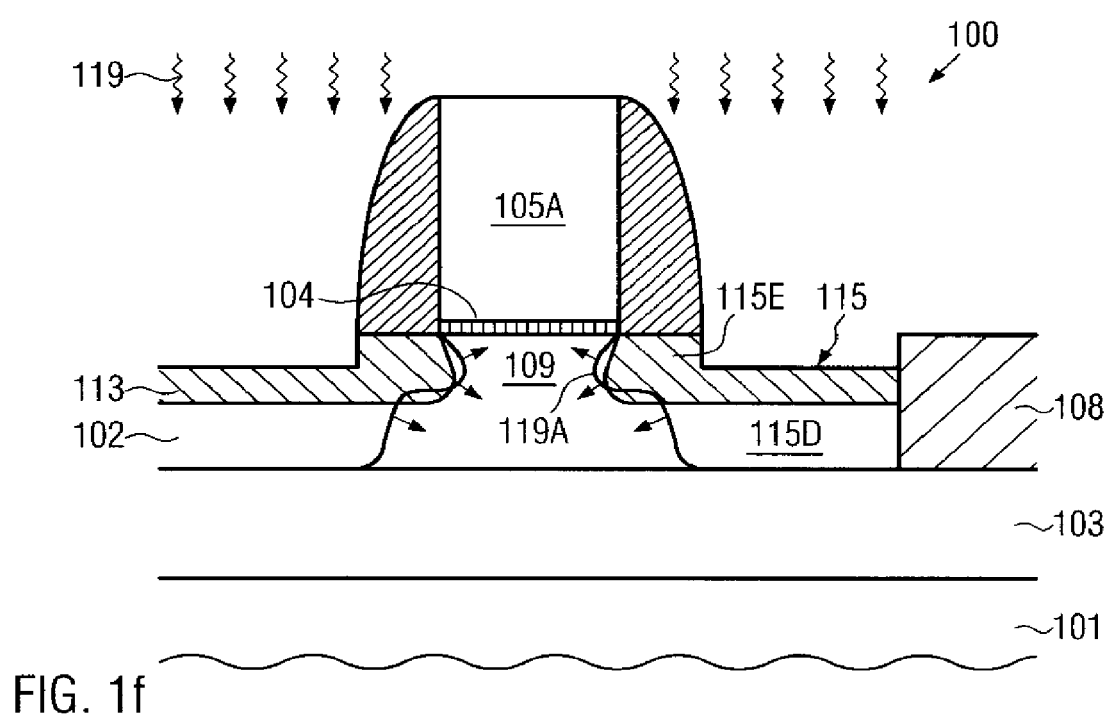

FIG. 1f schematically illustrates the semiconductor device 100 during an anneal process 119 designed to activate the dopants of the drain and source regions 115 and re-crystallize implantation-induced damage in these areas. In one illustrative embodiment, the anneal process 119 may comprise an anneal step designed to create a specified lateral diffusion, as indicated by arrows 119A, in order to adjust a desired effective channel length in the channel region 109. For example, the anneal process 119 may comprise an anneal step performed on the basis of well-established anneal techniques using temperatures in the range of approximately 600-1000° C., in combination with an appropriately selected process time for causing a desired thermal budget, resulting in the desired lateral dopant profile. Due to the high dopant concentration in the deep drain and source regions 115D obtained by providing the recesses 117A (FIG. 1e), a vertical diffusion may not be required and hence the respective process parameters may be exclusively selected in view of appropriately adjusting the lateral profile. Prior to or after the respective anneal step for defining the effective channel length, a sophisticated radiation-based anneal process may be performed on the basis of a short exposure time, for instance, with an exposure time of one second and significantly less, such as several milliseconds and less, as previously explained. Thus, in this case, a significant diffusion may be substantially suppressed, thereby maintaining the previously established diffusion profile or the diffusion profile to be established in a subsequent "low temperature" anneal process for adjusting the effective channel length, wherein the moderately high temperatures of the short time anneal process of approximately 1100-1300° C. and even higher provide an efficient dopant activation. Consequently the drain and source regions 115 may be provided with high dopant concentration, low capacitance and a desired lateral dopant profile.

Figure 1G:
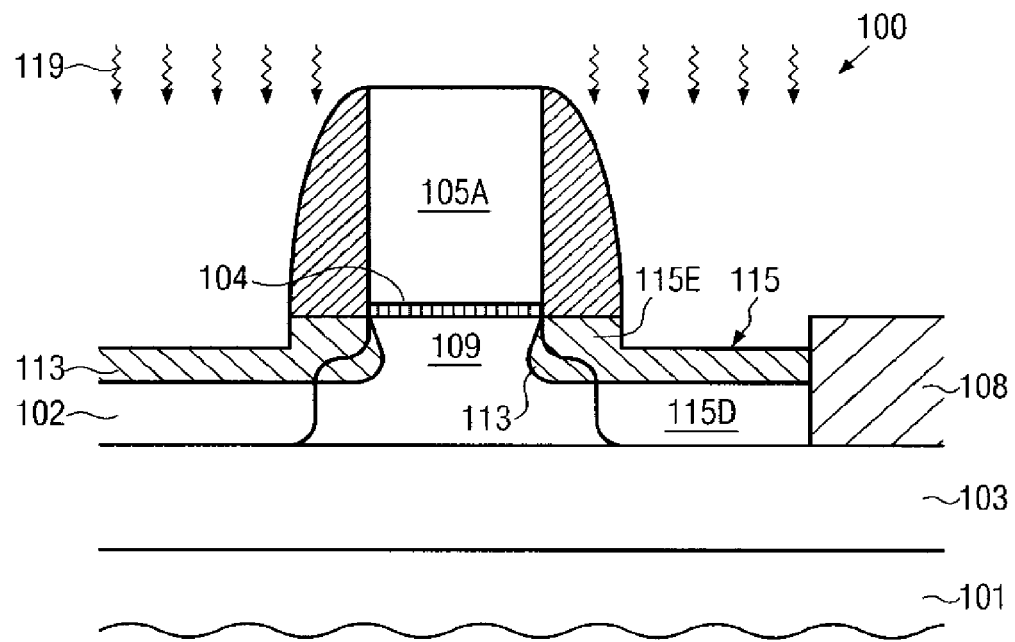
FIG. 1g schematically illustrates a variation of the transistor as shown in the FIGS. 1a-1f, wherein an anneal process may be used inducing a significantly reduced diffusion activity according to still further illustrative embodiments.

FIG. 1g schematically illustrates the device 100 during the anneal process 119 when designed as a short time radiation-based anneal process, thereby substantially maintaining the dopant profile as implanted. Thus, in this case, the respective position and characteristics of the PN junctions defined by the extension regions 115E and the deep drain and source regions 115D may be adjusted on the basis of the implantation process, in combination with the respective spacer widths of the spacers involved in profiling the drain and source region 115, such as the offset spacer 107 (FIG. 1b) and the spacer structure 116. Consequently, the device 100 may be formed with significantly reduced lateral dimensions, since both the offset spacer 107 and the spacer structure 116 may be provided with "minimum" widths since a significant lateral diffusion may be avoided due to the characteristics of the short time advanced laser-based or flashlight-based anneal process 119.

Figure 1H:
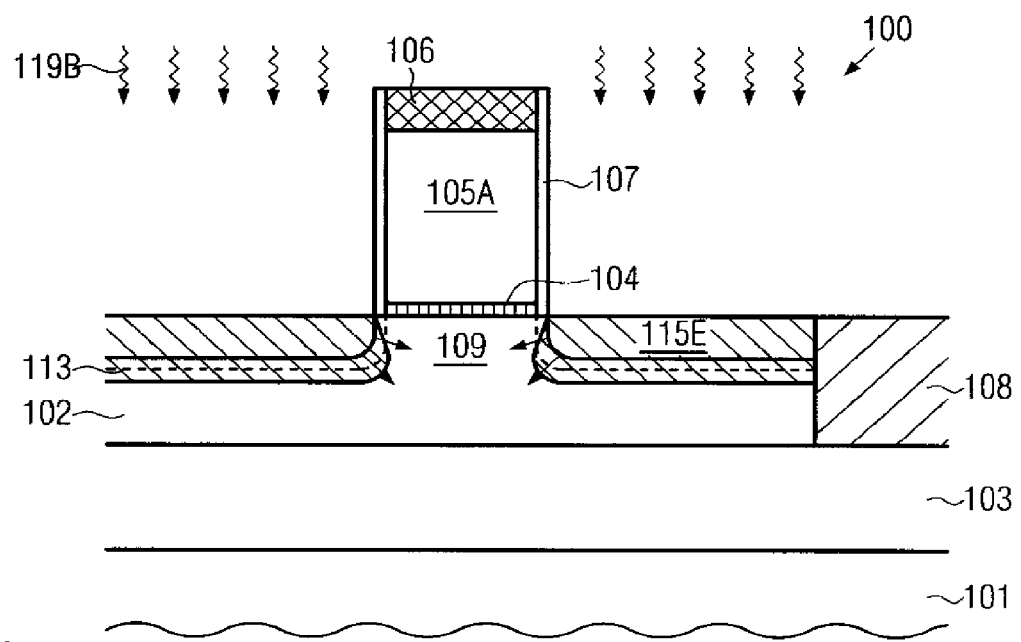
FIG. 1h schematically illustrates a transistor device in an early manufacturing stage, wherein an additional anneal process may be performed to define the lateral dopant profile and thus the effective channel length of extension regions prior to forming the recessed deep drain and source regions according to further illustrative embodiments.

FIG. 1h schematically illustrates the semiconductor device 100 according to further illustrative embodiments in which an anneal step 119B may be performed after forming the extension regions 115E and prior to forming the deep drain and source regions 115D. For example, as shown in FIG. 1h, the anneal process 119B may be performed prior to forming the spacer structure 116 to provide a high degree of process uniformity, when a laser-based or flashlight-based anneal process is used, since any interaction of the spacer structure 116 with the corresponding radiation may be avoided. In other cases, conventional rapid thermal anneal (RTA) regimes may be used wherein, however, the respective process parameters are specifically designed so as to adjust the diffusion behavior in order to appropriately define the effective channel length. In this case, other criteria, such as degree of dopant activation and the like, may not be relevant for selecting appropriate process parameters since the dopant activation may be accomplished during the anneal process 119 (FIG. 1g), wherein the pre-established shape of the extension regions 115E may also substantially be maintained.

Figure 1I:
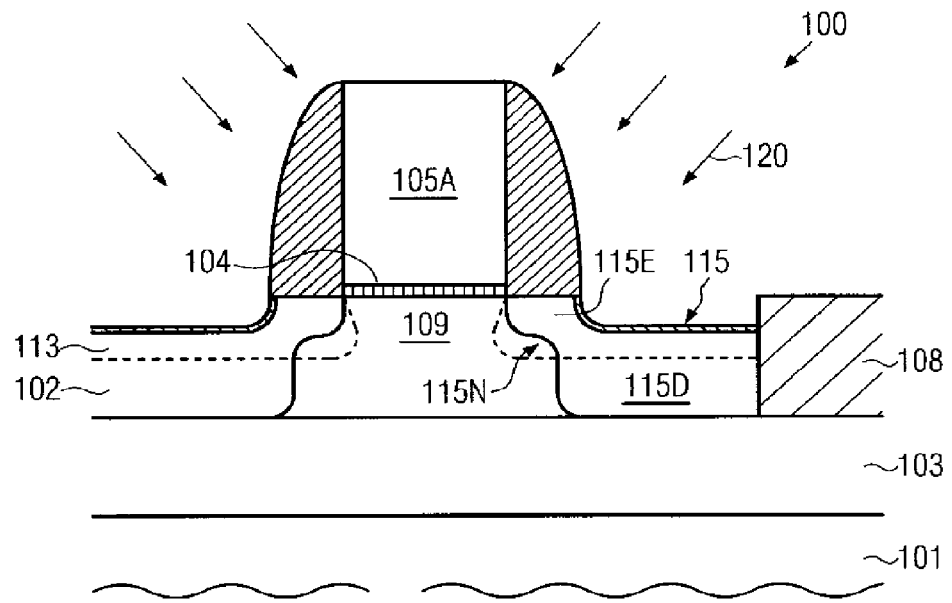
FIG. 1i schematically illustrates a cross-sectional view of a transistor having recessed deep drain and source regions extending to the buried insulating layer during a manufacturing stage for incorporating a further species to enhance the further processing and/or the performance of the transistor according to further illustrative embodiments.

FIG. 1i schematically illustrates the semiconductor device 100 according to further illustrative embodiments. As shown, the semiconductor device 100 may be subjected to a treatment 120 for incorporating a further species into the material of the semiconductor layer 120 wherein the further species may be positioned further such that it may not extend to the buried insulating layer 103. In one illustrative embodiment, the treatment 120 may comprise an ion implantation process to increase the concentration of a non-silicon component in the semiconductor alloy 113 and/or to increase the extension of the semiconductor alloy 113 towards the buried insulating layer 103. Due to the reduced thickness of the remaining deep drain and source regions 115D, the corresponding implantation process after treatment 120 may be performed with high accuracy so as to position the respective alloy component close to the buried insulating layer 103 while nevertheless maintaining a sufficient amount of template material that adheres to the buried insulating layer 103 in order to obtain a strained semiconductor alloy upon the subsequent anneal process 119 for re-crystallizing damaged portions of the drain and source regions 115. For example, if the semiconductor alloy 113 comprises silicon/carbon which may typically comprise a carbon concentration of approximately 1-5 atomic percent, a comparable concentration may also be obtained on the basis of an implantation process. Similarly, in a silicon/germanium alloy, tin may be efficiently incorporated by ion implantation with increased accuracy, thereby significantly contributing to the overall strain, since the tin atoms may have a significantly greater covalent radius compared to germanium.

In other illustrative embodiments, the treatment 120 may comprise, in addition or alternatively to the previously described implantation process, the incorporation of an appropriate species near the exposed surface of the drain and source regions 115 to enhance the further processing of the device 100. For example, increased dopant concentration or an increased germanium concentration may be created near the surface in order to affect a subsequent silicidation process, if a further reduction of the series resistance of the drain and source regions 115 based on a metal silicide may be required. In this case, the additional increased concentration of the respective species may act as a silicide block material, which may significantly slow down the reaction speed in forming metal silicide, which may be advantageous in avoiding silicidation growth towards the PN junction, thereby possibly shorting the PN junction at an area 115N, where the distance between the PN junction and metal silicide may be smallest. Moreover, a significant decoupling between the silicide formation in the electrode portion 105A and the drain and source regions 115 may be obtained, since the respective species 120a may be efficiently blocked by the cap layer 106, thereby resulting an a non-hindered silicidation generation in the electrode portion 105a. In still other illustrative embodiments, the treatment 120 may comprise the incorporation of an appropriate species for enhancing or stabilizing the respective silicidation process, since some silicidation regimes may suffer from reduced efficiency or stability with respect to silicon-based semiconductor alloys, such as silicon/germanium including a high concentration of germanium. In this case, for instance, silicon may be implanted with high dose to significantly reduce the concentration of the other alloy component.

After forming the drain and source regions 115, the further processing may be continued on the basis of well-established techniques wherein, in some cases, a metal silicide may be formed, as for instance discussed with reference to FIG. 1i, followed by the deposition of an interlayer dielectric material, wherein, in illustrative embodiments, at least a portion of the respective material may be provided with high intrinsic stress to further increase the respective strain in the channel region 109. Due to the recessed configuration, the respective stress transfer mechanism from the overlying dielectric material into the channel region 109 may even be enhanced compared to conventional substantially planar drain and source configurations.

Figure 2:
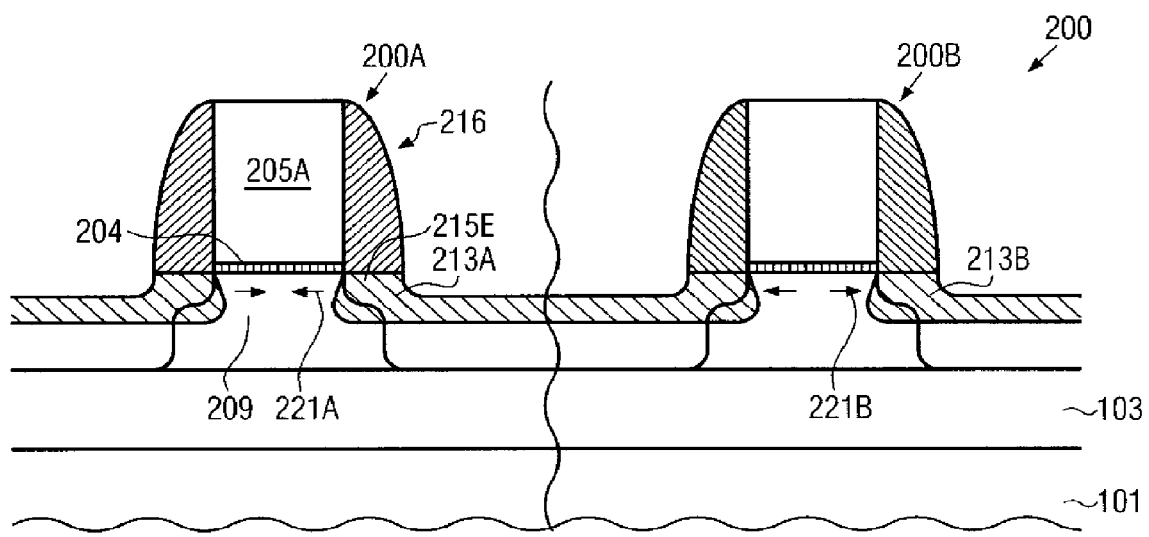
FIG. 2 schematically illustrates a cross-sectional view of a semiconductor device comprising two different types of transistors which may be different than the type of strained semiconductor alloy (as shown) or which may differ from each other in the recessed drain and source configuration.

FIG. 2 schematically illustrates a semiconductor device 200 comprising a first transistor 200A and a second transistor 200B, wherein at least one of the transistors 200A, 200B may have a configuration as is described with reference to the device 100. That is, the device 200 may comprise a substrate 201 including a buried insulating layer 103 above which may be formed a semiconductor layer 202, wherein these components may have the same characteristics as previously explained for the respective components of the device 100. Moreover, the transistors 200A, 200B may differ in at least one characteristic, such as the conductivity type, the configuration of the drain and source regions, i.e., recessed or not, the type of strain induced in the respective channel region, and the like. In the embodiment shown, the transistors 200A, 200B may represent a P-channel transistor and an N-channel transistor, respectively, wherein, in this case, both transistors 200A, 200B may have incorporated therein a strained semiconductor alloy 231A, 231B, respectively, for inducing the respective strain. Moreover, both transistors 200A, 200B may have a recessed drain/source configuration, as previously described with reference to the device 100, wherein it should be appreciated that, in other cases, one of the transistors 200A, 200B may be provided with a substantially planar configuration.

Thus, as shown, the transistors 200A, 200B may comprise an electrode portion 205A formed on the gate insulation layer 204, which separates the electrode portion 205A from a channel region 209. Furthermore, a spacer structure 216 may be provided which may substantially determine the width of respective recesses of drain and source regions 215, which may comprise an extension region 215E and a deep drain and source region 215D. In the example shown, the drain and source regions 215 of the first transistor 200A may comprise a high concentration of a P-type dopant material, while the transistor 200B may comprise in its drain and source regions 215 a high concentration of an N-type dopant material. Moreover, the strained semiconductor alloy 213A may provide respective compressive strain 221A in the channel region 209 of the first transistor 200A, while the semiconductor alloy 213B may provide a tensile strain 221B in the second transistor 200B.

The semiconductor device 200 may be formed on the basis of process techniques as previously described with reference to the device 100. For instance, as previously explained, the respective strained semiconductor alloys 213A, 213B may be created on the basis of an appropriate process sequence, for instance, including separate epitaxial growth techniques, implantation techniques and the like, possibly in combination. Thereafter, the further processing may be continued as previously described, that is, the respective extension regions 215E may be formed on the basis of well-established masking regimes and subsequently the recesses may be formed, for instance, in a common etch process, such as the process 117, in order to obtain the recessed source/drain configuration as illustrated. Thereafter, the deep drain and source regions 215E may be formed on the basis of the previously described process techniques. Consequently, the recessed drain/source configuration on the basis of a strained semiconductor alloy in the drain and source regions may be efficiently provided for different types of transistors, wherein a high degree of compatibility with existing process techniques may be maintained.

As a result, the subject matter disclosed herein provides methods and semiconductor devices featuring a recessed drain/source configuration, by which a high dopant concentration may be obtained in the deep drain and source regions, which may extend down to the buried insulating layer, for reducing the effective junction capacitance in SOI transistors. Since the recessing may be accomplished after the incorporation of a strained semiconductor alloy on the basis of a spacer structure providing an offset to the strained semiconductor alloy, the strain-inducing effect of the strained semiconductor alloy may be substantially maintained along the originally provided thickness thereof. Moreover, the techniques disclosed herein provide the potential for separately adjusting the effective channel length without undue diffusion, or respective implantation profiles may be maintained substantially as implanted on the basis of advanced radiation-based anneal techniques, thereby enabling a further reduction of lateral transistor dimensions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a first transistor having recessed drain and source regions, said drain and source regions are provided in recessed portions of a semiconductor layer and extend to a buried insulating layer;
a strained semiconductor alloy provided partially in said drain and source regions, said strained semiconductor alloy inducing a strain in a channel region of said first transistor, wherein a top surface of said strained semiconductor alloy opposite the buried insulating layer is recessed below an interface between a gate insulation layer and the channel region of the first transistor; and
an interlayer dielectric material formed above the top surface of said strained semiconductor alloy.

2. The semiconductor device of claim 1, wherein said strained semiconductor alloy has a compressive strain.

3. The semiconductor device of claim 1, wherein said strained semiconductor alloy has a tensile strain.

4. The semiconductor device of claim 1, further comprising a second transistor of a different conductivity type relative to said first transistor, said second transistor having substantially non-recessed drain and source regions.

5. The semiconductor device of claim 1, further comprising a second transistor of a different conductivity type relative to said first transistor, said second transistor having recessed drain and source regions extending to said buried insulating layer.

6. The semiconductor device of claim 5, wherein said second transistor comprises a further strained semiconductor alloy differing from said strained semiconductor alloy of said first transistor.

7. The semiconductor device of claim 1, further comprising a gate electrode structure with an electrode portion.

8. The semiconductor device of claim 7, wherein said electrode portion represents a conductive portion of the electrode structure and has a length of approximately 50 nm and less.

9. The semiconductor device of claim 1, having incorporated a further species into the semiconductor layer, wherein the further species is positioned such that it does not extend to the buried insulating layer.

10. The semiconductor device of claim 1, further comprising a spacer structure that is provided with a width for substantially defining a lateral dopant profile of deep drain and source regions.

11. The semiconductor device of claim 10, comprising further recesses whose offsets with respect to the channel region are substantially determined by the width of the spacer structure.

12. The semiconductor device of claim 10, wherein within the drain and source regions below the spacer structure, the strained semiconductor alloy is maintained with its original thickness, thereby providing an efficient strain-inducing mechanism in the channel region.

13. The semiconductor device of claim 1, wherein the drain and source regions further comprise an extension region.

14. The semiconductor device of claim 1, wherein a an appropriate species is incorporated near an exposed surface of said drain and source regions to enhance the further processing of the device.

15. The semiconductor device of claim 1, comprising a metal silicide layer formed at the top surface of said strained semiconductor alloy, and wherein the interlayer dielectric material is formed over the metal silicide layer in the recessed portion of semiconductor layer.

16. The semiconductor device of claim 1, wherein the interlayer dielectric material is provided with an intrinsic stress to increase the strain in the channel region over the strain provided in the channel region by said strained semiconductor alloy.

17. A semiconductor device, comprising:
a first and a second transistor having drain and source regions, said drain and source regions are provided in recessed portions of a semiconductor layer and extending to a buried insulating layer,
wherein said first transistor has incorporated therein a strained semiconductor alloy and said second transistor has incorporated therein the strained semiconductor alloy for inducing a respective strain,
wherein said strained semiconductor alloy comprises recessed portions in said drain and source regions with respect to a portion provided below a gate electrode;
wherein a top surface of said strained semiconductor alloy opposite the buried insulating layer is recessed below an interface between a gate insulation layer and a channel region of the first transistor, and
wherein an interlayer dielectric material is formed above the top surface of said strained semiconductor alloy.

18. The semiconductor device of claim 17, wherein said first transistor is a P-channel transistor and said second transistor is an N-channel transistor.

19. The semiconductor device of claim 18, wherein the strained semiconductor alloy provides respective compressive strain in the channel region of the P-channel transistor.

20. The semiconductor device of claim 18, wherein the strained semiconductor alloy provides respective tensile strain in the channel region of the N-channel transistor.

21. The semiconductor device of claim 17, further comprising a spacer structure which substantially determines widths of respective recesses of said drain and source regions.

22. The semiconductor device of claim 17, wherein said drain and source regions comprise an extension region and a deep drain and source region.

23. The semiconductor device of claim 17, wherein a metal silicide layer is formed at the top surface of said strained semiconductor alloy, and wherein the interlayer dielectric material is formed over the metal silicide layer in the recessed portion of semiconductor layer.

24. The semiconductor device of claim 17, wherein the interlayer dielectric material is provided with an intrinsic stress to increase the strain in the channel region over the strain induced by said strained semiconductor alloy.

* * * * *

UNITED STATES PATENT AND TRADEMARK OFFICE
CERTIFICATE OF CORRECTION

| | |
|---|---|
| PATENT NO. | : 8,183,605 B2 |
| APPLICATION NO. | : 12/791290 |
| DATED | : May 22, 2012 |
| INVENTOR(S) | : Thomas Feudel, Markus Lenski and Andreas Gehring |

It is certified that error appears in the above-identified patent and that said Letters Patent is hereby corrected as shown below:

Column 17, claim 14, line 21, delete "a".

Signed and Sealed this
Seventeenth Day of July, 2012

David J. Kappos
*Director of the United States Patent and Trademark Office*